Figure 1:
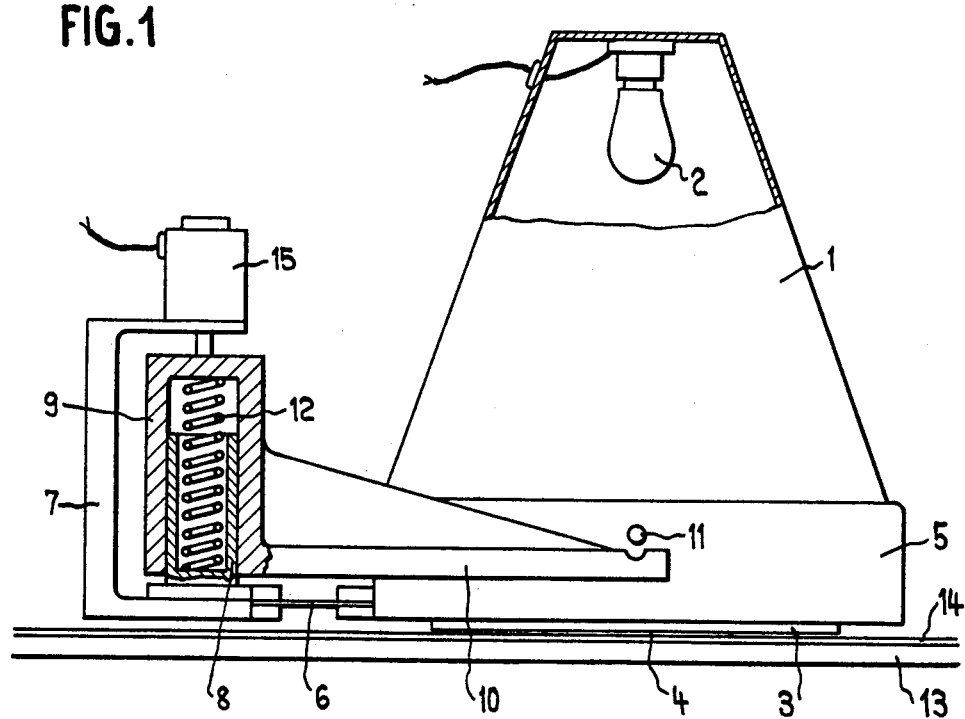

United States Patent [19]

Zumbach

[11] 4,094,605

[45] June 13, 1978

[54] APPARATUS FOR PRODUCING IDENTICAL SHEETS OF MATERIAL HAVING A NUMBER OF REPRESENTATIONS THEREON

[75] Inventor: Bruno Zumbach, Orpund, Switzerland

[73] Assignee: Zumbach Electronic AG, Orpund, Switzerland

[21] Appl. No.: 795,169

[22] Filed: May 9, 1977

Related U.S. Application Data

[60] Continuation of Ser. No. 535,857, Dec. 23, 1974, abandoned, which is a division of Ser. No. 176,767, Aug. 27, 1971, Pat. No. 3,868,756.

[30] Foreign Application Priority Data

Aug. 31, 1970 Germany .............................. 2043121

[51] Int. Cl.² ............................................. G03B 27/04
[52] U.S. Cl. ..................................................... 355/95
[58] Field of Search ...................... 29/407; 355/53, 54, 355/95, 96, 112, 113, 132

[56] References Cited

U.S. PATENT DOCUMENTS

| | | | |
|---|---|---|---|
| 2,244,497 | 6/1941 | McNaney | 355/113 X |
| 3,176,601 | 4/1965 | Bradley | 355/95 |
| 3,353,469 | 11/1967 | Grover | 355/95 |

OTHER PUBLICATIONS

I.B.M. Technical Disclosure Bulletin, vol. 7, No. 4, 9/1964, pp. 329-30, Step and Repeat Camera, N. Chand.

*Primary Examiner*—Donald A. Griffin

[57] ABSTRACT

An apparatus for producing identical flat carriers each having an identical representation thereon, by the steps of providing a plurality of individual representations on a flat material in a predetermined mutual relationship, providing at least two reference marks on the flat material in predetermined relationship with respect to the representations, mounting the flat material carrying the representations in a preset position relative to a punch device by means of the reference marks and successively punching out the individual carriers from the flat material by the punch device.

9 Claims, 5 Drawing Figures

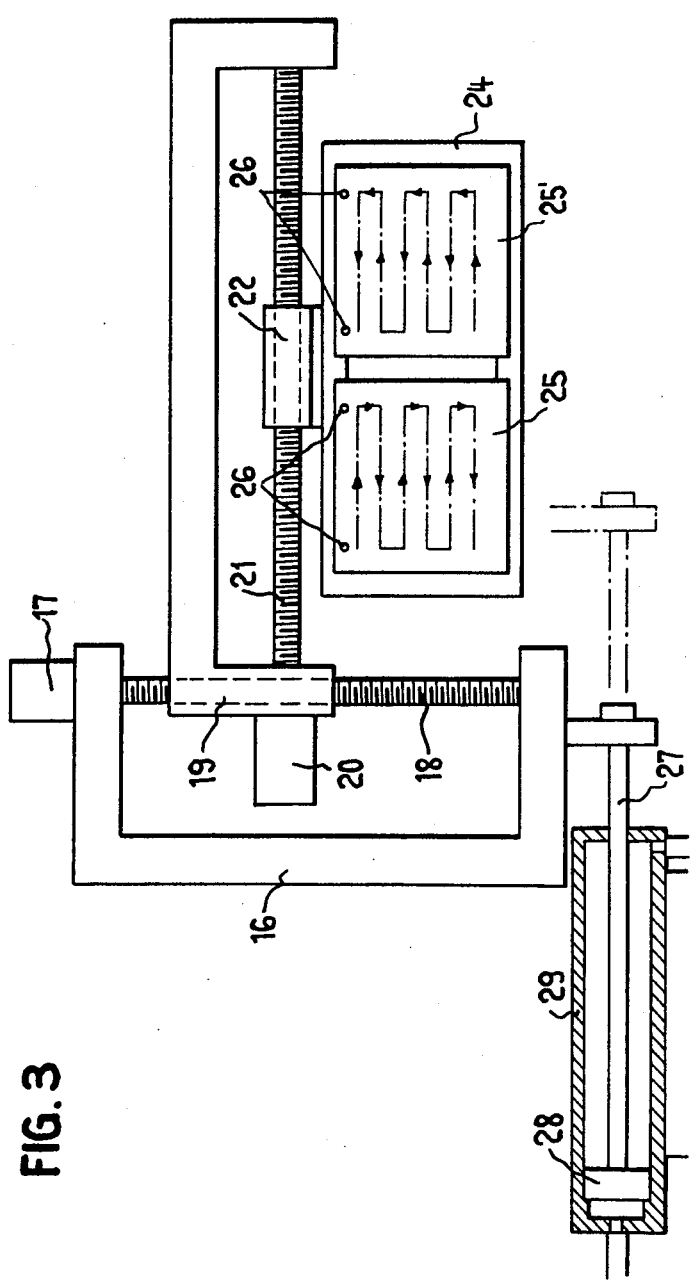
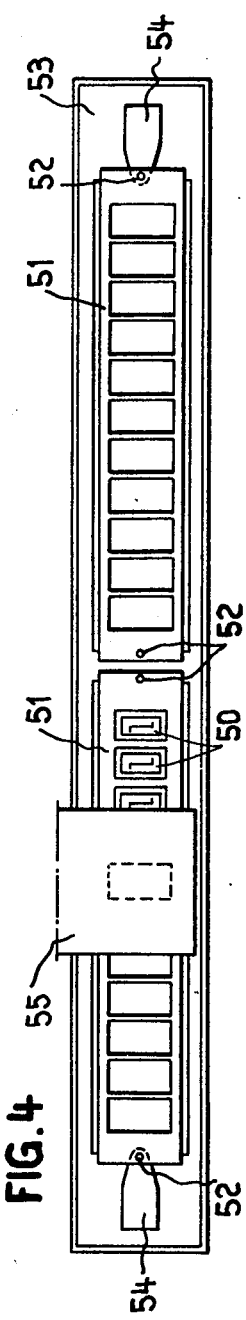
FIG. 3
FIG. 4

APPARATUS FOR PRODUCING IDENTICAL SHEETS OF MATERIAL HAVING A NUMBER OF REPRESENTATIONS THEREON

CROSS-REFERENCE TO RELATED APPLICATION

This application is a continuation of application Ser. No. 535,857 filed Dec. 23, 1974, now abandoned, which was a divisional application of application Ser. No. 176,767 filed Aug. 27, 1971, now U.S. Pat. No. 3,868,756, and the priority from my patent application Number 2 043 121 filed in Germany on Aug. 31, 1970 is claimed in the present application.

The present invention relates to an apparatus for producing large numbers of flat carriers, such as facias, printed circuits or the like, having indentical representations thereon. A flat material is provided by a reproduction process with a plurality of representations thereon and then carriers having an individual representation are cut out. An object of the invention is to reproduce the representations on the carrier and them to cut them out in a rational manner and with the required precision.

In a known method this object is achieved in that each representation has reference holes associated therewith. The position of these holes is pre-printed by means of printing blocks during the printing of the representations. Then for example, during a further operation all the necessary reference holes are drilled, generally two per representation, and then the individual facias are punched out, the two reference holes serving to position the carrier with respect to the punch. This procedure is cumbersome and time wasting. The flat material, such as sheet metal is badly utilised, because considerable space has to be left between the individual representations to accommodate the reference holes.

It is also known for whole sheets of metal to have a plurality of representations printed thereon which are punched out in one operation. This pre-supposes a very accurate positioning of the sheet or sheet metal both in the printing device and in the punching device. Moreover, the mutual position of all the printing and punching members has to be accurately adjusted. Any change of dimensions of the carrier and / or representations necessitates high equipment costs.

It is an object of the present invention to provide a simple and reliable apparatus allowing substantially automatically the production of mass articles such as facias, printed circuits and the like.

In accordance therefore with the present invention there is provided an apparatus for producing sheets of material having each a number of representations thereon, comprising a reproduction device and means for the adjustment of the reproduction device for applying representations on said sheet, said reproduction device having a vertically displacable fluoroscopy bell on the underside of which an original drawing or transparency of a representation can be fitted, the fluoroscopy bell being connected to a carriage by means of elastic suspension means such that the bottom portion of the bell may closely be applied against said sheet disposed below it. The fluoroscopy bell which is elastically suspended preferably by means of leaf springs, may easily be lowered onto the sheet preferably a photographic film or any other flat material having a photosesitive layer thereon, whereby the bottom side of the bell may closely be applied against the sheet due to its elastic suspension, thereby allowing a highly accurate reproduction of the drawing or transparency placed in the bell. The bell may easily be lifted off the sheet for displacement from one place where the representation has to be copied to the next place, this displacement being done by means of an automatic positional control. When all representations have been copied on one sheet, the latter is then placed in a cutting device, where individual carriers are cut out, the cutting device for cutting each carrier with its representation being controlled by a positional control similar to the one used for reproduction.

Preferably said reproduction device has an auxiliary source of illumination on said bell for depicting reference marks on said sheet, the auxiliary illumination being operable independently from the illumination of said fluoroscopy bell. It is thus possible to provide reference marks, for instance pairs of reference marks on each of said sheets, such reference marks allowing orientation of the sheet in the cutting device for cutting individual carriers.

Figure 2:
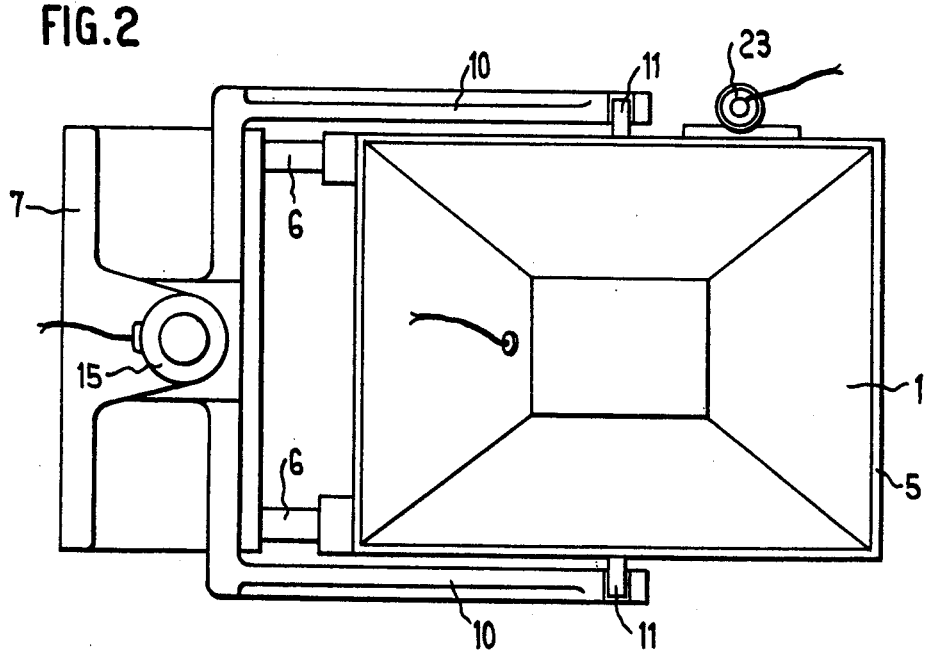
Figure 5:
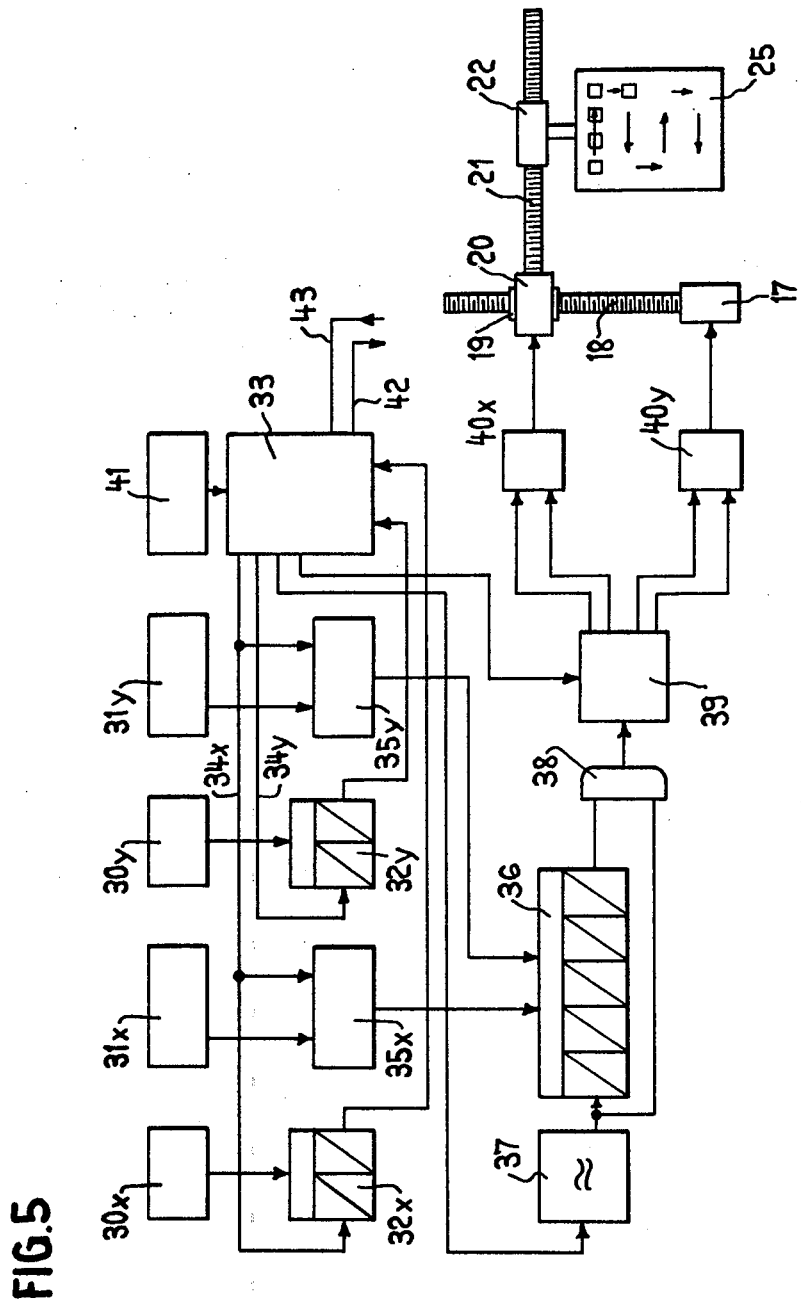

A preferred embodiment of the present invention will hereinafter be described with reference to the accompanying drawings, in which:

FIG. 1 shows a side view partly in section of a device for reproducing representations, FIG. 2 shows a plan view of the device of FIG. 1, FIG. 3 shows schematically a part of an apparatus for punching out carriers, FIG. 4 shows an alternative embodiment for punching out carriers, FIG. 5 shows a block diagram for controlling the punching operation.

To produce facias, flat plates and the like which carry a representation on the face thereof, for example, inscriptions, divisions into squares, frames and the like, a printing block is first produced by photographic and photo-chemical means which is provided with a plurality of individual representations in a predetermined mutual arrangement. For this purpose, a film is produced from an original drawing or a reduced transparency thereof, which film is then used directly to produce the printing block by photochemical means.

For producing the film the auxiliary device shown in FIGS. 1 and 2 is used. It has a fluoroscopy bell 1 which is closed at the top and carries a light source 2. The lower rectangular opening of the bell 1 is covered by a glass plate 3 retained in a frame 5. An original drawing or a transparency 4 is mounted in a certain position on the underside of the plate 3 and the remainder of the plate is completely covered. The frame 5 is connected by means of two leaf springs 6 to a carrier 7 and is thereby retained to be vertically movable in a certain horizontal position with respect to the carrier 7. A bush 9 is mounted on a sleeve 8 which is connected to the carrier 7. The bush 9 can be displaced in the vertical direction together with the base of a U-shaped lifting fork 10. The arms of the fork 10 engage below pins 11 of the frame 5 and act to lift this frame 5 and the fluoroscopy bell 1 when required. A compression spring 12 normally retains the bush 9 and the lifting fork 10 in a upperend position in which the frame 5 and the glass plate 3 are lifted from a vacuum clamping table 13 or a film 14 clamped thereon. An impact magnet 15 acts to lower the parts 9, 10 and 1-5 into the position shown in the FIGS. 1 and 2, in which the drawing or the transparency 4 is supported on the film 14. A cross wire illumination 23 which permits a reference cross to be exposed on the film 14 is mounted on the frame 5.

Either the carrier 7 or the clamping table 13 is mounted on an adjustable cross slide in accordance with rectangular coordinates while the other of these parts is fixedly mounted. Such a cross slide is shown schematically in FIG. 3 in a different connection. A spindle 18 is rotatably mounted in a first frame 16 and can be rotated by means of a stepping motor 17. The spindle 18 acts to displace a second frame 19 in the Y direction. A spindle 21 is rotatably mounted in the frame 19 and is adapted to be driven by a stepping motor 20. The spindle 21 acts to displace a support 22 in the X direction. The claming table 13 or the carrier 7 is connected to a support, as the support 22, which is adjustable in a similar manner. It is hence possible by suitable positional control to adjust the relative position of the frame 5 or the image or transparency 4 with respect to the clamping table 13 or the film 14 in uniform steps. The precision of the adjustment depends only upon the magnitude of the uniform step and the accuracy of the mechanism.

By means of the automatic positional control individual representations are dipicted line by line on the film 14 by displacing the raised fluoroscopy bell 1 in steps, lowering the bell and then, with the bell lowered switching on the source of illumination 2. The leaf springs 6 provide a readily displaceable simple and cheap connection of the bell 1 to the carrier 7, allowing the bell 1 to be displaced horizontally and vertically with respect to the quasi-rigid film 14. The drawing or transparency 4 can therefore be placed against the film 14 always in parallel therewith and without clearance and in accurate position with respect to the carrier 7. Thus, one line from left to right, e.g. in X direction, is exposed, and then after corresponding adjustment in the Y direction a second line in X direction from right to left is exposed and so on. The cross wire illumination 23 is switched on in two definite positions before or after exposure of the individual representations and exposes on the film a cross wire located at two points outside the representations.

The film is now developed and a printing block produced by photochemical means. With this printing block the plates, e.g. metal plates, are printed, and as well as the individual representations, two cross wires are reproduced. In each of these cross wires one reference hole is drilled. Thus, the plates which are to be punched out to form the individual facias each with a representation, are provided with two reference holes by means of which the plate is suspended on accurately positioned pins of a frame.

FIG. 3 shows schematically a few components of a punch device for punching out facias. A frame 24 is mounted on the above-described support 22. As indicated, it is dimensioned to simultaneously expose two plates 25 and 25', two pins 26 each being provided to suspend the plates. The frame 16 and all components connected therewith including frame 24 are connected to a piston rod 27 which can be displaced by means of a piston 28 and cylinder 29 into two end positions accurately determined by stops. The distance between the end positions accurately corresponds to that between corresponding positions of the plates 25 and 25'. In the region of plate 25' there is a punch, not shown, acting to punch out of the plate a facia.

By means of a positional control system, which corresponds accurately in every respect to that for the above-described exposure of the film, and with the aid of the stepping motors 17 and 20 and the spindles 18 and 21, the support 22 and hence the frame 24 together with the plates 25 and 25' are adjusted step by step in an alternately reversed direction along successive lines and thereby attain a position which accurately corresponds to a position attained when exposing the film 14. The positional control stops' briefly and a facia carrying an individual representation is punched out. As indicated on the plate 25', punching occurs line for line in an upward direction. When the plate 25' has been processed completely in this manner, the positional control stops in its end position (top left hand position) and the whole system is then displaced by means of the piston 28 to the right and into the position shown in chain-dotted lines in which position the plate 25 is moved under the punch. Since the plates are offset accurately by the displacement path of the piston 28, the plate 25 assumes the starting position for punching out the first representations. Punching out now occurs in reverse, i.e. line by line downwards, as indicated on plate 25 in FIG. 3. Hence no time is lost in returning the positional control into its other end position. Thus, whilst the plate 25 is being processed a new plate 25' may be inserted, so that after all facias have been punched out of the plate 25, a displacement of the frame 24 by means of the piston 28 suffices to bring the newly inserted plate into the starting position such that the processing thereof can be commenced.

Depending upon the production figures to be accomplished, any combinations of units may be provided. For low production a mechanism in accordance with FIG. 3 together with an electronic positional control may suffice, this plant being usable both for reproduction and for punching in that the support 22 can be optionally connected e.g. to the device shown in FIGS. 1 and 2 and the device shown in FIG. 3. It is, however, also possible to connect an electronic system optionally to one of two adjusting devices shown in FIG. 3, one of which serves reproduction and the other punching. It is thus necessary to ensure particularly that the mechnisms are set up as precisely and similarly as possible so that equal electronic information leads to equal mechanical movements and positions. Generally, however, separate plants for reproduction and punching will be provided.

Reproduction may also be effected in a different manner to that described. It is, for example, possible to provide a printing block having an individual representation thereon and to print the plates therefrom while automatically controlling the plates, rather than prepare a film for a whole plate and from this etch a printing block for printing a whole plate. In the plant shown in FIG. 3 it would, for example, be conceivable to control further positions with the same movement cycle and to continuously provide plates with representations by means of printing or other reproduction method, which plates are subsequently punched out, if necessary, after a certain waiting time of the same plant.

When producing printed circuits or other mass produced articles methods adapted to these articles may be used, in which the principle is that reproduction of the representations, whether inscriptions, circuits or others is effected by an identical positional control and the individual carriers each having a representation thereon are subsequently separated and maintained.

It is also possible, instead of reproducing a representation in each position or punching out a carrier, to produce and/or punch out simultaneously per operation a plurality of representations.

Certain punching devices permit only line by line carriers or representations to be cut out. In this case the plates after printing have to be cut in strips each with a line of representations. In this case at the beginning and end of each line a reference point or trapping hole has to be provided. All the representations of the line are positioned with reference to these holes and all the carriers are cut from a strip by reference thereto.

FIG. 4 shows schematically an apparatus for cutting out individual representations 50 from flat material strips 51 which are provided with reference hole 52 at each end. Two strips 51 are clamped on an elongated table or carrier 53. The table 53, like the table 24 shown in FIG. 3, is displaceable step by step by means of the positional control and is moreover displaceable by a fixed amount relative to the drive, as explained in connection with FIG. 3. At the adjacent inner ends of both strips a pin firmly embedded in the table engages without clearance in one positional hole and hence anchors this end of the strip on the table in a certain position. Pins also engage without clearance at the outer ends of the strips in the positional holes of both strips. Each of these outer pins is mounted on a slide 54 accurately guided in the longitudinal direction of the table 53 and strips 51. The two slides are constantly drawn outwards by a mechanism, not shown, which in the simplest case may be tension springs. The strips 51 are hence stressed for tension in the longitudinal direction. Practice shows that only in this manner can the strips be retained flat so that the representations can be punched out precisely.

Thus, it is essential with this method of operation that the punching out of the individual representations occurs away from the end of the strip engaged by the tension, as indicated in FIG. 4. The strip shown on the left clearly shows that some representations have already been punched out from the particular end held under tension, and that the representations adjacent to the firmly anchored end are punched out last. This arrangement has quite definite significance. It has been shown that, subject to the tractive force required for retaining the strip flat, the strips where representations have already been punched out and consequently very little material remains, are elongated to such an extent that accurate punching out is no longer possible. If, on the other hand the end at which the last representation has been punched out is firmly anchored, then the strip between this anchoring point and the punch 55 has sufficient rigidity that its theoretical elongation is of no practical importance.

On the right in FIG. 4, a blank strip 51 is indicated which is replaced by a new one, whilst representations are punched out from the other strip.

Instead of exposing a film, which subsequently serves to produce a printing plate as shown in FIGS. 1 and 2, a printing plate having a sensitized layer in a manner as explained by way of FIGS. 1 and 2 can be exposed directly with individual representations and reference marks. After the plate has been developed and etched it can be used in the manner described for printing on flat material.

Lines may also replace dots as reference marks. These lines, which are used for accurate positioning of the flat material for punching out the representations, can be photoelectrically scanned, as can dot-like marks, the positioning of the flat material before punching being effected automatically by electronic means. The reference lines, however, may also serve to accurately trim the edges of the flat material, and the edges can subsequently be used as stops for positioning the flat material during the punching out of the representations.

Instead of digital positioning using stepping motors, accurate positioning can also be achieved using predetermined analogous stored steps. Independently thereof, a fine adjustment of the positioning may be required or advantageous. for example, when producing printed circuits in accordance with the the relatively inaccurate screen printing method and/or the above-mentioned analogous positioning. This fine adjustment can be carried out very simply, by scanning photographically definite point representation and is based on the fact that a simple, quick and accurate correction of the position could be carried out before the representation concerned is punched out. In an analogous control the fine adjustment could be carried out by means of one and the same electromechanical system as the aforesaid predetermined positioning.

Instead of applying the reference marks successively in two positions of the reproduction device with a depicting system 23, it is also possible to provide two depicting systems mounted in fixed relative position and in a certain position relative to the representations to be reproduced. These depicting systems are rendered active in a certain position of the reproduction device and simultaneously plot two reference marks.

What I claim is:

1. A photocopying apparatus for producing sheets of material each having a number of representations thereon, comprising rigid support means for fixing a sheet, a reproduction device and means for the adjustment of the reproduction device in steps for applying representations on said sheet in different places, said reproduction device having a fluoroscopy bell and lifting means for lifting it transversely off said sheet, and on the underside of which an original drawing or transparency of a representation can be fitted, said fluoroscopy bell including a source of illumination for illuminating said drawing or transparency, and the fluoroscopy bell being connected to a carriage by suspension means substantially rigid in a direction parallel to said sheet but elastic in a direction transversely to said sheet, a loose connection between a portion of said lifting means and said fluoroscopy bell allowing free alignment of the fluoroscopy bell to said sheet and support means respectively if the fluoroscopy bell rests on said sheet and support means respectively, such that the bottom portion of the fluoroscopy bell may closely be applied against said sheet disposed below it but the location of said fluoroscopy bell on said sheet being substantially rigidly determined by said suspension means.

2. A photocopying apparatus as claimed in claim 1, comprising an auxiliary source of illumination optically separate from said source of illumination, this auxiliary source of illumination being fixed on said fluoroscopy bell for photocopying reference marks indicative for the position of representations on the sheet.

3. An apparatus according to claim 2, wherein said support means for fixing a sheet is at least one clamping table for supporting the sheet, and wherein said means for the adjustment of said reproduction device are actuatable by a presetable positional control, said source of illumination for reproducing representations and said auxiliary source of illumination for reproducing reference marks being operable independently of each other.

4. An apparatus as claimed in claim 3, comprising two clamping devices on said clamping table for the sheet, and a punch device, the clamping table being displaceable by a fixed stroke corresponding to the distance between said two clamping devices.

5. An apparatus as claimed in claim 3, wherein the clamping table is provided with pins which are adapted to engage in positional holes provided in the sheet.

6. An apparatus according to claim 1, wherein said sheet is a photographic film.

7. An apparatus as claimed in claim 1, wherein said suspension means include at least one leaf spring interconnecting said carriage and said fluoroscopy bell, said leaf spring being in a plane substantially parallel to said sheet.

8. A photocopying apparatus for producing sheets of material each having a number of representations thereon, comprising rigid support means for fixing a sheet, a reproduction device and means for the adjustment of the reproduction device in steps for applying representations on said sheet in different places, said reproduction device having a fluoroscopy bell and lifting means for lifting it transversely off said sheet, and on the underside of which an original drawing or transparency of a representation can be fitted, said fluoroscopy bell including a source of illumination for illuminating said drawing or transparency, and the fluoroscopy bell being connected to a carriage by suspension means substantially rigid in a direction parallel to said sheet but elastic in a direction transversely to said sheet, said lifting means including a lifting member adapted to loosely engage said fluoroscopy bell from below for lifting it but said lifting member being disengaged from said fluoroscopy bell thereby allowing free alignment of the fluoroscopy bell to said sheet when the fluoroscopy bell rests on said sheet, such that the bottom portion of the fluoroscopy bell may closely be applied against said sheet disposed below it but the location of said fluoroscopy bell on said sheet being substantially rigidly determined by said suspension means.

9. A photocopying apparatus as claimed in claim 8, wherein said lifting member is a fork having legs extending along opposite sides of the fluoroscopy bell, lateral projections of the fluoroscopy bell being adapted to be engaged by said legs for lifting the fluoroscopy bell.

* * * * *